(12) United States Patent
Yamazaki et al.

(10) Patent No.: US 7,139,620 B2
(45) Date of Patent: Nov. 21, 2006

(54) PREDICTION METHOD AND APPARATUS OF A PROCESSING RESULT

(75) Inventors: Yoshihiro Yamazaki, Nirasaki (JP); Hisonori Sakai, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 455 days.

(21) Appl. No.: 10/798,283

(22) Filed: Mar. 12, 2004

(65) Prior Publication Data

US 2004/0181299 A1 Sep. 16, 2004

(30) Foreign Application Priority Data

Mar. 12, 2003 (JP) .............................. 2003-067116

(51) Int. Cl.
*G06F 19/00* (2006.01)
*G05B 13/02* (2006.01)
*B05C 11/00* (2006.01)
*G01N 31/00* (2006.01)
*G01N 33/50* (2006.01)
*G01N 33/46* (2006.01)

(52) U.S. Cl. .................. 700/44; 700/121; 700/146; 700/38; 118/63; 118/712; 118/713; 118/714; 356/72; 702/30; 702/19

(58) Field of Classification Search ............... 700/44, 700/121, 146, 38; 118/63, 712, 713, 714; 356/72; 702/30
See application file for complete search history.

(56) References Cited

U.S. PATENT DOCUMENTS

| 6,197,116 B1 * | 3/2001 | Kosugi ...................... 118/712 |
| 6,616,759 B1 * | 9/2003 | Tanaka et al. ................ 118/63 |
| 6,650,947 B1 * | 11/2003 | Fu et al. ........................ 700/38 |
| 6,961,636 B1 * | 11/2005 | Chong et al. ............... 700/121 |
| 7,058,470 B1 * | 6/2006 | Tanaka et al. ............... 700/121 |
| 2003/0199108 A1 * | 10/2003 | Tanaka et al. ................ 438/14 |
| 2005/0252884 A1 * | 11/2005 | Lam et al. ..................... 216/59 |

* cited by examiner

*Primary Examiner*—Ramesh Patel
*Assistant Examiner*—Sunray Chang
(74) *Attorney, Agent, or Firm*—Oblon, Spivak, McClelland, Maier & Neustadt, P.C.

(57) ABSTRACT

In a method and apparatus for predicting process results of objects being processed in a processing chamber of a processing apparatus, operation data and process result data obtained at the time of processing each of the objects are collected and a multivariate analysis is performed on the basis of the collected operation data and process result data to obtain a first correlation therebetween. Process results are predicted on the basis of the first correlation. Weighting coefficients for the respective operation data are set on the basis of the predicted process results. A second correlation between the weighted operation data and the process result data is obtained by a multivariate analysis. Process results are predicted by using operation data, obtained when objects other than the objects used to obtain the second correlation are processed, on the basis of the second correlation.

18 Claims, 11 Drawing Sheets

FIG. 8

| ORDER | WAVE-LENTH | CONTRIBUTION DIFFERENCE | ORDER | WAVE-LENTH | CONTRIBUTION DIFFERENCE |
|---|---|---|---|---|---|
| 1 | 395 | 15.2 | 55 | 615 | 0 |
| 2 | 380 | 10.55 | 56 | 660 | 0 |
| 3 | 385 | 10.46 | 57 | 715 | 0 |
| 4 | 230 | 10.37 | 58 | 900 | -0.02 |
| 5 | 240 | 9.81 | 59 | 685 | -0.03 |
| 6 | 405 | 8.54 | 60 | 585 | -0.15 |
| 7 | 265 | 7.07 | 61 | 485 | -0.19 |
| 8 | 260 | 5.07 | 62 | 605 | -0.21 |
| 9 | 255 | 4.62 | 63 | 205 | -0.24 |
| 10 | 235 | 4.27 | 64 | 450 | -0.31 |
| 11 | 270 | 4.24 | 65 | 855 | -0.33 |
| 12 | 250 | 4.09 | 66 | 490 | -0.39 |
| 13 | 465 | 3.95 | 67 | 530 | -0.41 |
| 14 | 470 | 3.82 | 68 | 610 | -0.53 |
| 15 | 245 | 3.64 | 69 | 515 | -0.6 |
| 16 | 215 | 3.52 | 70 | 555 | -0.67 |
| 17 | 370 | 3.05 | 71 | 590 | -0.67 |
| 18 | 400 | 3 | 72 | 525 | -0.71 |
| 19 | 390 | 2.79 | 73 | 865 | -0.74 |
| 20 | 225 | 2.65 | 74 | 440 | -0.97 |
| 21 | 365 | 1.78 | 75 | 580 | -1.08 |
| 22 | 665 | 1.48 | 76 | 630 | -1.22 |
| 23 | 780 | 1.31 | 77 | 280 | -1.26 |
| 24 | 640 | 1.19 | 78 | 495 | -1.39 |
| 25 | 355 | 1.08 | 79 | 945 | -1.45 |
| 26 | 645 | 0.98 | 80 | 275 | -1.57 |
| 27 | 375 | 0.91 | 81 | 455 | -1.7 |
| 28 | 480 | 0.89 | 82 | 940 | -2.04 |
| 29 | 475 | 0.76 | 83 | 830 | -2.09 |
| 30 | 360 | 0.74 | 84 | 935 | -2.17 |
| 31 | 880 | 0.64 | 85 | 545 | -2.18 |
| 32 | 220 | 0.6 | 86 | 345 | -2.42 |
| 33 | 815 | 0.59 | 87 | 925 | -2.56 |
| 34 | 575 | 0.49 | 88 | 535 | -.27 |
| 35 | 650 | 0.47 | 89 | 310 | -2.8 |
| 36 | 285 | 0.42 | 90 | 550 | -2.81 |
| 37 | 565 | 0.41 | 91 | 350 | -3.06 |
| 38 | 890 | 0.27 | 92 | 330 | -3.1 |
| 39 | 885 | 0.26 | 93 | 540 | -3.3 |
| 40 | 620 | 0.23 | 94 | 425 | -3.46 |
| 41 | 675 | 0.2 | 95 | 460 | -3.97 |
| 42 | 200 | 0.19 | 96 | 295 | -4.01 |
| 43 | 210 | 0.17 | 97 | 445 | -4.37 |
| 44 | 560 | 0.15 | 98 | 500 | -4.6 |
| 45 | 570 | 0.14 | 99 | 335 | -5.27 |
| 46 | 870 | 0.11 | 100 | 340 | -5.56 |
| 47 | 895 | 0.11 | 101 | 305 | -5.73 |
| 48 | 655 | 0.1 | 102 | 320 | -5.75 |
| 49 | 625 | 0.07 | 103 | 435 | -5.83 |
| 50 | 875 | 0.05 | 104 | 300 | -6.57 |
| 51 | 775 | 0.02 | 105 | 315 | -6.87 |
| 52 | 520 | 0.01 | 106 | 325 | -8.16 |
| 53 | 725 | 0.01 | 107 | 290 | -8.31 |
| 54 | 600 | 0 | 108 | 430 | -8.48 |

PREDICTION METHOD AND APPARATUS OF A PROCESSING RESULT

FIELD OF THE INVENTION

The present invention relates to a method and an apparatus for predicting the process results of objects to be processed, such as wafers to be processed by a semiconductor manufacturing apparatus, or the status of the apparatus.

BACKGROUND OF THE INVENTION

In a semiconductor manufacturing process, a plurality of processing apparatuses have been used. For example, a processing apparatus, such as a plasma processing apparatus, has been widely used in a film forming process or an etching process of objects to be processed, such as semiconductor wafers or glass plates. For example, in the plasma processing apparatus, process gas introduced into an airtight processing chamber is converted into plasma, and then the surface of an object to be processed, for example, a semiconductor wafer, is plasma-processed. Therefore, during the repetition of the plasma-processing, a reaction product is generated and attached to an inner wall of the processing chamber, thus delicately varying the status of the plasma. Since such a variation of the plasma status influences the results of processing the wafer, e.g., etching the wafer, the process results should be closely monitored so as to consistently execute a stable process.

Due to the above reason, for example, test wafers are manufactured in advance and an etching process is periodically executed with respect to each of the test wafers, so that the status of a processing apparatus after etching each of the wafers may be examined on the basis of the process results (for example, the quantity of abrasion of the test wafers) obtained through the etching process.

However, in order to examine the status of the processing apparatus on the basis of the test wafers, it is necessary to manufacture a great number of test wafers. Moreover, since a large number of test wafers should be processed using the processing apparatus and respective process results thereof should be measured, there is a problem in that many processes and a lot of time are required for the manufacturing of test wafers and the measurement of process results.

Meanwhile, as disclosed in Japanese Patent Laid-open Publication No. H10-125660, a process monitoring method for a plasma processing apparatus has been proposed. In this method, after a modeling equation used to correlate an electrical signal, in which plasma status is reflected, with plasma process characteristics is set up using a test wafer, a detected value of an electrical signal obtained when an actual wafer is processed is applied to the modeling equation, thus accurately predicting the plasma process characteristics.

However, the above process monitoring method is advantageous in that the plasma processing characteristics can be predicted, but problematic in that the data, such as the detected value of an electrical signal used when setting up the modeling equation, may not occasionally be sufficient to perform a high accuracy prediction, so that further improvements are required.

For example, among the data used at the time of setting up the modeling equation, data contributing toward deteriorating a prediction value with respect to an actual measurement value may exist. In this case, if all data are used without the selection of data proper for setting up the modeling equation, prediction results may occasionally be worse.

SUMMARY OF THE INVENTION

It is, therefore, a primary object of the present invention to provide a method and an apparatus for predicting a result of processing an object by using a correlation (regression equation and model) between operation data and process result data obtained by employing a multivariate analysis, thereby an accuracy of predicting the results of processing the object being improved.

In accordance with a first aspect of the present invention, there is provided a method for predicting process results on the basis of operation data and process result data of a processing apparatus while a plurality of objects are processed in a processing chamber of the processing apparatus, including the steps of: (a) collecting operation data and process result data obtained at the time of processing each of the objects; (b) performing a multivariate analysis on the basis of the collected operation data and process result data to obtain a first correlation between the operation data and the process result data; (c) predicting process results using operation data, obtained when objects other than the objects used to obtain the first correlation are processed, on the basis of the first correlation; (d) setting weighting coefficients for the respective operation data used at the step (b) on the basis of the predicted process results at the step (c); (e) obtaining weighted operation data by multiplying the operation data by the respective weighting coefficients corresponding thereto, and performing a multivariate analysis on the basis of the weighted operation data and the process result data to obtain a second correlation between the weighted operation data and the process result data; and (f) predicting process results using operation data, obtained when objects other than the objects used to obtain the second correlation are processed, on the basis of the second correlation.

In accordance with a second aspect of the present invention, there is provided an apparatus for predicting process results on the basis of operation data and process result data of a processing apparatus while a plurality of objects are processed in a processing chamber of the processing apparatus, including: a data collection unit for collecting operation data and process result data obtained at the time of processing each of the objects; a first analysis unit for performing a multivariate analysis on the basis of the collected operation data and process result data and obtaining a first correlation between the operation data and the process result data; a first prediction unit for predicting process results using operation data, obtained when objects other than the objects used to obtain the first correlation are processed, on the basis of the first correlation; a weighting coefficient setting unit for setting weighting coefficients for the respective operation data used by the first analysis unit on the basis of the predicted process results; a second analysis unit for obtaining weighted operation data by multiplying the operation data by the respective weighting coefficients corresponding thereto, and performing a multivariate analysis on the basis of the weighted operation data and the process result data to obtain a second correlation between the weighted operation data and the process result data; and a second prediction unit for predicting process results using operation data, obtained when objects other than the objects used to obtain the second correlation are processed, on the basis of the second correlation.

In accordance with the first and second aspects of the present invention, a first prediction (preliminary prediction) is performed using the collected operation data, the weighting coefficients are set on the basis of results of the first prediction to obtain the weighted operation data, and then a second prediction (main prediction) is performed to calculate final prediction values. Therefore, the influence of operation data (for example, wavelength data) having an adverse influence on the results of the first prediction (preliminary prediction) is eliminated or decreased when the second prediction (main prediction) is performed, thus improving prediction accuracy.

Further, in the predicting method and apparatus, when the weighting coefficients are set, the predicted process results of the first prediction and actual process results, which are obtained at the time of processing each of the objects, are compared with each other to obtain a first contribution of the operation data, which indicates that the predicted process results of the first prediction deviate or shift above the actual process results, and a second contribution of the operation data, which indicates that the predicted process results of the first prediction deviate or shift below the actual process results, so that the weighting coefficients may be set on the basis of a difference between the first and the second contributions.

Further, more particularly, the first contribution may be the contribution of operation data, obtained when the predicted process results of the first prediction deviates above the actual process results, with respect to reference operation data; and the second contribution may be the contribution of operation data, obtained when the predicted process results of the first prediction deviate below the actual process results, to the reference operation data.

In this way, the prediction results can be corrected even in a case where a prediction value deviates below an actual measurement value, as well as a case where a prediction value deviates above an actual measurement value, so that suitable weighting coefficients can be obtained.

Further, as the difference between the first and second contributions is larger, a lower weighting coefficient may be set, while as the difference is smaller, a higher weighting coefficient may be set.

With the above-described process of setting the weighting coefficients, operation data having an adverse influence on prediction accuracy in the first prediction (preliminary prediction) are corrected, thus reducing the influence thereof on prediction accuracy in the second prediction (main prediction).

Further, when the weighting coefficients are set, plural sets of weighting coefficients are obtained, each of the sets being based on different references with respect to operation data of the same object, a multivariate analysis is performed with respect to weighted operation data obtained for each set of weighting coefficients to predict process results, and a set of weighting coefficients, obtained when the predicted process results are closest to actual process results, may be selected. Therefore, more accurate weighting coefficients can be obtained, thus further improving prediction accuracy.

Further, each of the weighting coefficients may be set to "0" or "1" whereby operation data weighted by "0" is eliminated and operation data weighted by "1" is maintained. Therefore, the influence of the operation data weighted by "0" on the prediction accuracy can be eliminated.

Further, the operation data may be optical data, such as the emission spectrum intensities of wavelengths. Accordingly, the process results for the objects may be predicted by eliminating or reducing an adverse influence of the wavelengths on prediction results.

Further, the process result data may be the process dimensions of an object to be processed, such as the dimension of a shape formed by an etching process. Accordingly, the process dimensions, a measurement of which requires a lot of time and manual operations, are predicted with high accuracy, thus simplifying the monitoring of the process dimensions. Further, with respect to the total number of objects to be processed, process dimensions can be predicted with high accuracy, thus performing suitable monitoring.

Further, the multivariate analysis may be performed by employing a Partial Least Squares (PLS) method. By utilizing the PLS method, a correlation between the operation data and the process result data can be easily obtained even though an amount of the operation data is large.

BRIEF DESCRIPTION OF THE DRAWINGS

The above and other objects, features and other advantages of the present invention will be more clearly understood from the following detailed description taken in conjunction with the accompanying drawings, in which:

FIG. 8 provides a table showing the contributions of FIG. 7 arranged in a descending order;

DETAILED DESCRIPTION OF THE PREFERRED EMBODIMENTS

Figure 1:
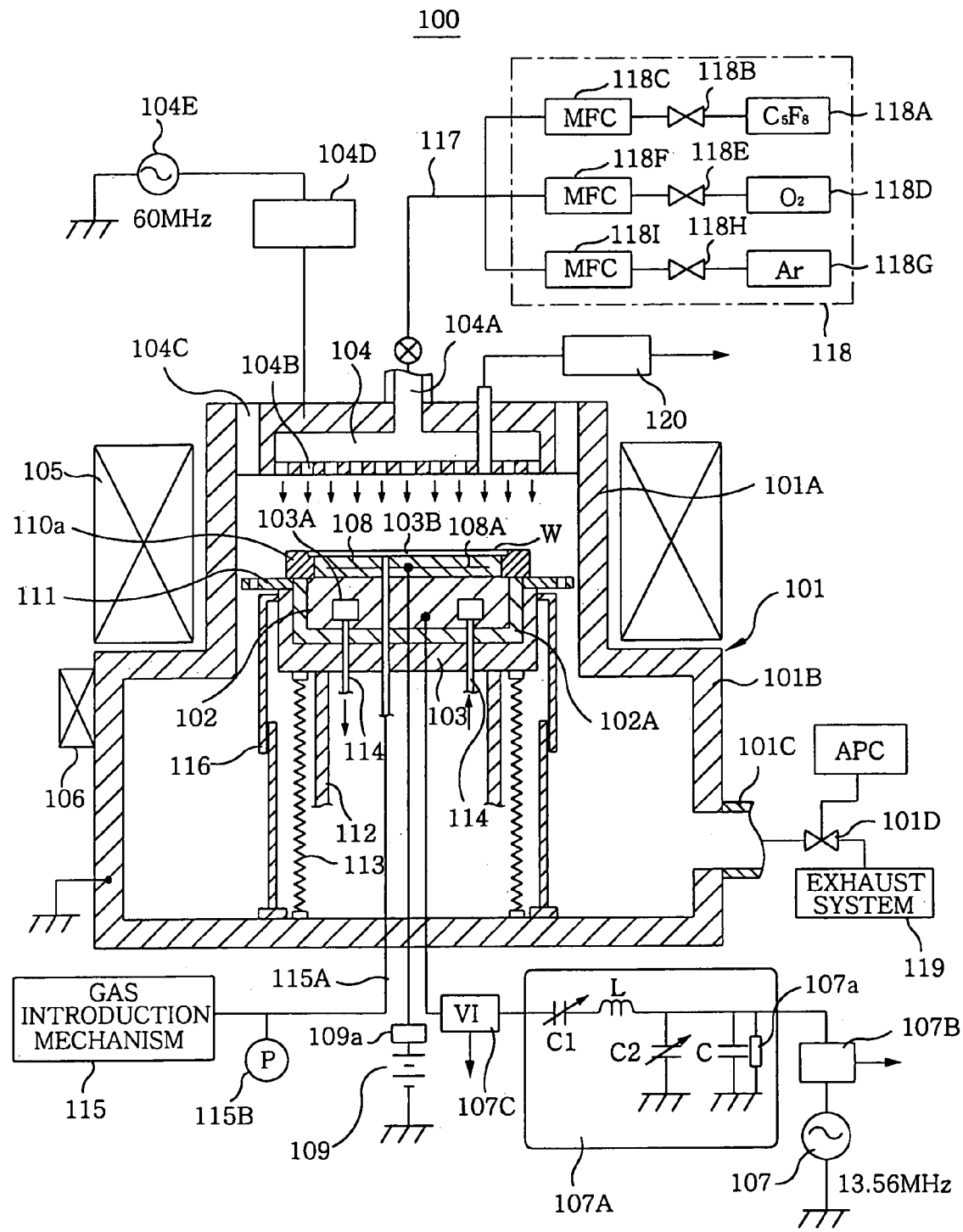
FIG. 1 is a sectional view of a processing apparatus in accordance with a preferred embodiment of the present invention.

Hereinafter, a method and an apparatus for predicting process results in accordance with preferred embodiments of the present invention will be described in detail with reference to the attached drawings. Reference will now be made in detail to the present preferred embodiments of the present invention, examples of which are illustrated in the accompanying drawings, wherein like reference numerals refer to like elements throughout.

(Processing Apparatus)

First, a magnetron reactivity etching processing apparatus (hereinafter referred to as a "processing apparatus 100") will be described as a plasma etching apparatus in accordance with a preferred embodiment of the present invention. As shown in FIG. 1, the processing apparatus 100 includes a processing chamber 101 made of aluminum, a vertically movable support 103 made of aluminum and placed to support a lower electrode 102 arranged in the processing chamber 101 through an insulating material 102A, and a shower head 104 (hereinafter referred to as an "upper electrode" if necessary) placed over the support 103 to supply process gas and to function as the upper electrode. The upper electrode 104 is insulated from the processing chamber 101 through an insulating material 104C.

A first Radio Frequency (RF) power source 104E is connected to the upper electrode 104, and a matching circuit 104D is disposed on a feeder line between the upper electrode 104 and the first RF power source 104E. The first RF power source 104E has a frequency approximately ranging from 50 to 150 MHz. In this way, RF power is applied to the upper electrode 104, so that higher density plasma can be formed in a preferable dissociation state within the processing chamber 101, thus executing a plasma process under a condition with a pressure lower than that of a conventional plasma processing apparatus. The first RF power source 104E preferably has a frequency ranging from 50 to 80 MHz, and typically employs a frequency of 60 MHz as shown in FIG. 1 or its adjacent frequency.

The upper electrode 104 is connected to a spectroscope 120 (hereinafter referred to as an "optical measurement device") to detect plasma emissions from the processing chamber 101. The emission spectrum intensities of wavelengths detected by the optical measurement device 120 are used as optical data.

The processing chamber 101 includes an upper chamber 101A with a small diameter in an upper portion thereof, and a lower chamber 101B with a large diameter in a lower portion thereof. The upper chamber 101A is surrounded by a dipole ring magnet 105. The dipole ring magnet 105 is constructed in such a way that a plurality of column-shaped anisotropic segment magnets are accommodated and arranged in a casing formed of a ring-shaped magnetic body and form equal horizontal magnetic fields directed in one direction in the upper chamber 101A. A gate is formed on an upper portion of the lower chamber 101B to carry the wafer W into and out of the processing chamber 101, and a gate valve 106 is installed at the gate.

The lower electrode 102 is connected to a second RF power source 107 through an electrical measurement device (for example, a VI prove) 107C, a matching circuit 107A and a power meter 107B. The second RF power source 107 has a frequency ranging from several hundreds of kHz to several tens of MHz. Power having such a frequency is applied to the lower electrode 102, so that suitable ionization can be formed on the wafer W, which is an object to be processed, without damage to the wafer W. The second RF power source 107 typically has a frequency of 13.56 MHz as shown in FIG. 1 or a frequency of 2 MHz.

In the matching circuit 107A, a measuring device (not shown) for measuring an RF voltage Vpp of the lower electrode side 102 (an RF voltage output side) is provided. Particulary, the matching circuit 107A includes, for example, two variable condensers C1 and C2, a condenser C, and a coil L, and then performs impedance matching through the variable condensers C1 and C2.

The matching circuit 107A is provided with a power meter 107a whereby the matching circuit 107A can measure a voltage Vdc between a feeder line of the second RF power and the ground of the processing apparatus 100.

Second RF power P supplied from the second RF power source 107 is measured by a power meter 107B connected to the lower electrode side 102 (an RF power output side) of the matching circuit 107A. In the upper chamber 101A, a magnetron discharge occurs due to an electric field generated by the RF power source 107 and the horizontal magnetic fields generated by the dipole ring magnet 105 throughout the process gas, so that the plasma of the process gas supplied to the upper chamber 101A is generated.

Further, RF voltages V, RF currents I, RF phases P and impedances Z of both fundamental waves (progressive wave and reflection wave of RF power) and harmonic waves based on the plasma generated in the upper chamber 101A can be detected as electrical data by the RF power P applied to the lower electrode 102 through the electrical measurement device (for example, VI prove) 107C.

An electrostatic chuck 108 is arranged on an upper surface of the lower electrode 102, and an electrode plate 108A thereof is connected to a Direct Current (DC) power source 109. By applying a high voltage to the electrode plate 108A from the DC power source 109 in a high vacuum state, the electrostatic chuck 108 electrostatically absorbs thereto the wafer W. A power meter 109a for detecting the current and voltage applied to the electrostatic chuck 108 is disposed between the electrode plate 108A of the electrostatic chuck 108 and the DC power source 109.

A focus ring 110A is placed on an outer circumference of the lower electrode 102 to focus the plasma generated in the upper chamber 101A onto the wafer W. An exhaust ring 111 mounted on the support 103 is placed below the focus ring 110A. A plurality of holes, through which gas within the upper chamber 101A is exhausted to the lower chamber 101B, are formed through a peripheral portion of the exhaust ring 111 at regular intervals along a circumferential direction thereof.

The support 103 is placed to be vertically movable between the upper chamber 101A and the lower chamber 101B through ball screw mechanism 112 and a bellows 113. Therefore, when the wafer W is to be provided into the lower electrode 102, the lower electrode 102 descends up to the lower chamber 101B through the support 103, the gate valve 106 is opened, and then the wafer W is placed on the lower electrode 102 by a conveying machine (not shown).

A coolant path 103A connected to a coolant line 114 is formed in the support 103, so that coolant is circulated within the coolant path 103A through the coolant line 114, thus controlling a temperature of the wafer W to be at a predetermined value.

A gas flow path 103B is formed through the support 103, the insulating material 102A, the lower electrode 102 and the electrostatic chuck 108, so that, e.g., He gas is supplied as backside gas from the gas introduction mechanism 115 to a narrow gap between the electrostatic chuck 108 and the wafer W through a gas line 115A at a predetermined pressure. Therefore, heat conductivity between the electrostatic chuck 108 and the wafer W is improved through the He gas. The pressure of the backside gas is detected through a pressure sensor (not shown) and the detected pressure is displayed on a pressure gauge 115B. Further, reference numeral 116 denotes a bellows cover. Further, the gas introduction mechanism 115 is provided with, for example, a mass flow controller (not shown) by which the flow rate of the backside gas can be detected.

A gas introduction portion 104A is formed on the shower head 104 and connected to a process gas supply system 118 through a line 117. The process gas supply system 118 includes a $C_5F_8$ gas supply source 118A, an $O_2$ gas supply source 118D and an Ar gas supply source 118G.

These gas supply sources 118A, 118D and 118G supply respective gases to the shower head 104 at predetermined flow rates through respective valves 118B, 118E and 118H and respective mass flow controllers 118C, 118F and 118I, thus controlling the respective gases to be mixed at a predetermined mixture ratio within the shower head 104. A plurality of holes 104B are formed in the entire bottom surface of the shower head 104 at regular intervals. Through the holes 104B, the gas mixture is supplied from the shower head 104 into the upper chamber 101A as process gas.

Further, in FIG. 1, reference numerals 101C and 119 denote an exhaust pipe, and an exhaust system including a vacuum pump connected to the exhaust pipe 101C, respectively. The exhaust pipe 101C is connected to an Auto Pressure Controller (APC) valve 101D, the opening ratio of which is automatically controlled on the basis of the pressure of gas in the processing chamber 101.

(Multivariate Analysis Device)

Figure 2:
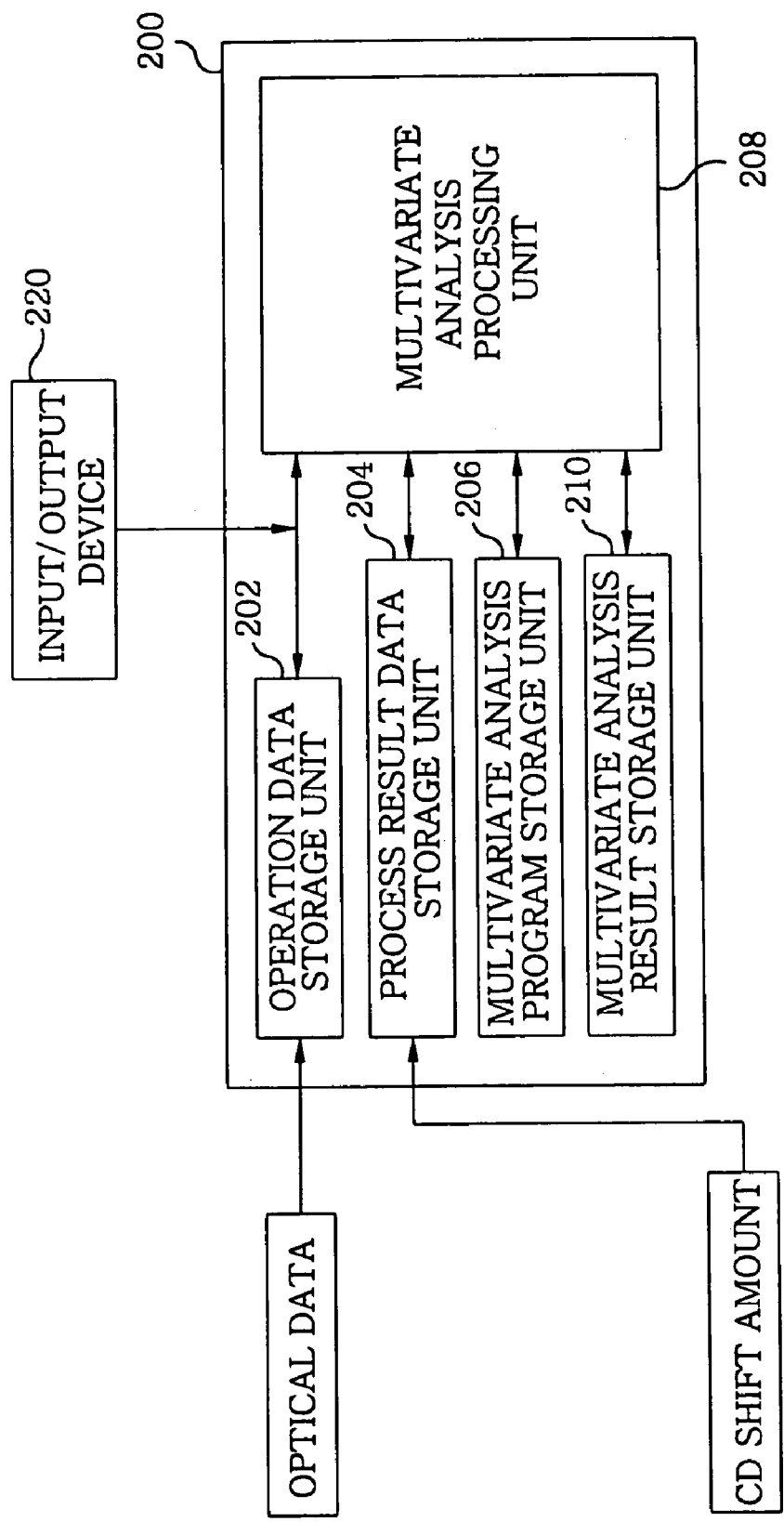
FIG. 2 is a block diagram of a multivariate analysis device included in the processing apparatus in accordance with the preferred embodiment of the present invention.

As shown in FIG. 2, the processing apparatus 100 includes, for example, a multivariate analysis device 200 for statistically processing operation data and process result data and an input/output device 220 for outputting information such as analysis results while receiving process result data. The processing apparatus 100 performs a multivariate analysis with respect to both the operation data and the process result data through the multivariate analysis device 200 to obtain a correlation therebetween, and outputs corresponding information such as analysis results through the input/output device 220 if necessary.

The multivariate analysis device 200 includes an operation data storage unit 202, a process result data storage unit 204, a multivariate analysis program storage unit 206, a multivariate analysis processing unit 208, and a multivariate analysis result storage unit 210.

The operation data storage unit 202 constitutes a unit for storing the operation data, and the process result data storage unit 204 constitutes a unit for storing the process result data. The multivariate analysis processing unit 208 constitutes a unit for obtaining a correlation (for example, a prediction equation or a regression equation) between the operation data and the process result data and a unit for predicting process results on the basis of the correlation. The multivariate analysis result storage unit 210 constitutes a unit for storing the correlation calculated by the multivariate analysis processing unit 208.

The multivariate analysis device 200 may be preferably implemented with, for example, a microprocessor operating on the basis of a program stored in the multivariate analysis program storage unit 206. The operation data storage unit 202, the process result data storage unit 204 and the multivariate analysis result storage unit 210 may be implemented with recording units, such as memories, respectively, or with respective memory regions provided in a recording unit such as a hard disk.

The multivariate analysis device 200 receives the operation data and process characteristic data and stores the above data in the operation data storage unit 202 and the process result data storage unit 204, respectively, loads therefrom the data and the program from the multivariate analysis program storage unit 206 into the multivariate analysis processing unit 208, performs a multivariate analysis for the operation data and the process characteristic data through the multivariate analysis processing unit 208, and then stores the process results thereof in the multivariate analysis result storage unit 210.

In this case, the operation data represents data detected by a plurality of measuring devices provided in the processing apparatus 100 at the time of processing the wafer W. The process result data represents process characteristic data on the wafer W obtained after processing the wafer W, and apparatus status data on the status of the processing chamber 101. The operation data are intermittently measured during the processing of the wafer W, and the process result data are measured as required after the processing of the wafer W. These measurement results are stored in the storage units 202 and 204, respectively.

In this embodiment of the present invention, it is preferable to use data easily influencing process results as operation data so as to obtain the correlation between the operation data and the process result data. In this embodiment, optical data are used as the operation data. Emission spectrum intensities of wavelengths detected by the above-described optical measurement device 120 are used as the optical data. In particular, for example, the emission spectrum intensities of 153 wavelengths arranged at intervals of 5 nm within a range of 195 to 955 nm are used. The emission spectrum intensity of each of the used wavelengths is set to a mean value obtained when one wafer is etching-processed. In the present invention, the multivariate analysis is performed with respect to the remaining data obtained by subtracting data on wavelengths adversely influencing prediction accuracy from optical data collected as the operation data. A method of selecting data used for the multivariate analysis will be described in detail later.

Figure 3:
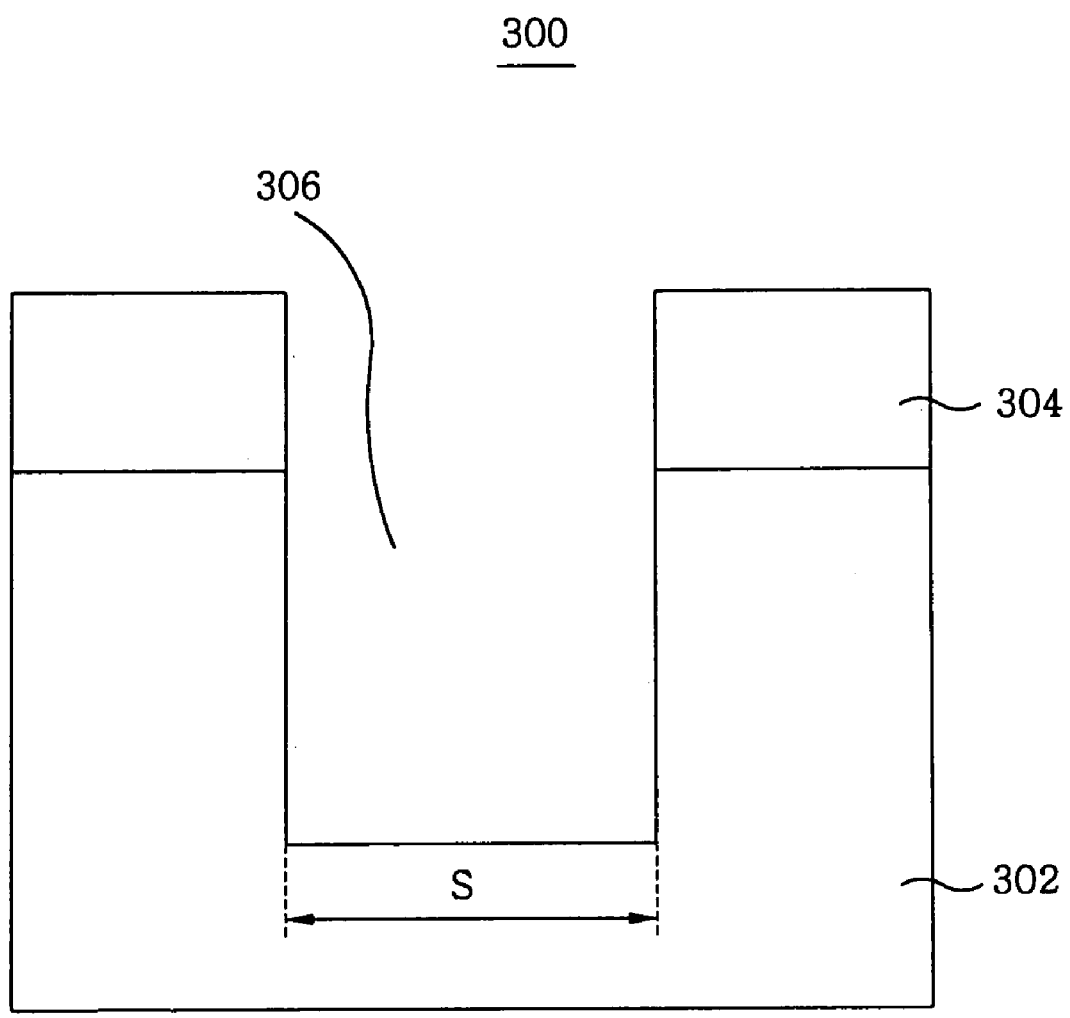
FIG. 3 illustrates a film structure etched by employing the processing apparatus in accordance with the preferred embodiment of the present invention.

Further, data related to etching, such as a predetermined dimension of a shape formed by etching the wafer W, are used as process characteristic data of the process result data. In the embodiment of the present invention, the amount of Critical Dimension (CD) shift of a hole formed by the etching process is used for the process result data. For example, the etching process is executed with respect to a structure of a film 300 of FIG. 3 formed on a wafer. The film structure 300 is constructed by forming a mask layer 304 on a silicon oxide film (for example, $SiO_2$ film) 302. An etching process is executed with respect to the film structure 300, so that a hole 306 is formed in the silicon oxide film 302. The line width S of the hole 306 at the bottom thereof is measured after the etching process, and a difference between the measured value and a target value (design value) is set to the amount of CD shift of the hole 306. After the etching process for each wafer, the amount of CD shift is obtained and stored in the process result data storage unit 204 as process result data.

In this embodiment, the multivariate analysis device 200 produces the following relational equation Eq. (1) (prediction equation or a model such as a regression equation), in which various types of operation data are set to explanatory variables and process characteristic data are set to explained variables (objective variables), using the multivariate analysis program. In the following regression equation, X represents a matrix of the explanatory variables, and Y represents a matrix of the explained variables. Further, B is a regression matrix comprised of coefficients (weighting coefficients) of the explanatory variables and E is a residual matrix.

$$Y = BX + E \qquad \text{Eq. (1)}$$

In this embodiment, in order to obtain equation Eq. (1), for example, a Partial Least Squares (PLS) method disclosed in Journal of Chemometrics, Vol. 2, pp 211–218 in 1998 is used. Even though a plurality of explanatory variables and explained variables are included in the matrices X and Y, respectively, the PLS method can obtain a relational expression between X and Y if a small number of actual measurement values exist in X and Y, respectively. Moreover, the PLS method is characterized in that, even though the relational expression is obtained from a small number of actual measurement values, stability and reliability are high.

The program for the PLS method is stored in the multivariate analysis program storage unit 206, so that the operation data and the process characteristic data are processed by the multivariate analysis processing unit 208 according to the sequence of the program to obtain equation Eq. (1) and the process results thereof are stored in the multivariate analysis result storage unit 210. Therefore, in this embodiment of the present invention, once equation Eq. (1) is obtained, the operation data is applied to the matrix X as the explanatory variables to predict process characteristics, which have high reliability.

For example, with respect to a matrix $X^T Y$, an i-th principal component corresponding to an i-th eigenvalue is represented by $t_i$. The matrix X is expressed by the following equation Eq. (2) using both a score $t_i$ and a vector $p_i$ of the i-th principal component, and the matrix Y is expressed by the following equation Eq. (3) using both the score $t_i$ and a vector $c_i$ of the i-th principal component. Further, in the following equations Eqs. (2) and (3), $X_{i+1}$ and $Y_{i+1}$ are the residual matrices of X and Y, respectively, and $X^T$ is a transpose matrix of X. Hereinafter, an index T is used to represent a transpose matrix.

$$X = t_1 p_1 + t_2 p_2 + t_3 p_3 + \ldots + t_i p_i + X_{i+1} \qquad \text{Eq. (2)}$$

$$Y = t_1 c_1 + t_2 c_2 + t_3 c_3 + \ldots + t_i c_i + Y_{i+1} \qquad \text{Eq. (3)}$$

In this way, the PLS method used in this embodiment of the present invention calculates a plurality of eigenvalues and the eigenvectors thereof using a small quantity of calculation in the case where equations Eqs. (2) and (3) are correlated with each other.

The PLS method is performed according to the following sequence. In a first stage thereof, centering and scaling operations for the matrices X and Y are performed. Then, by setting i to "1", $X_1 = X$ and $Y_1 = Y$ are obtained. Further, a first column of the matrix $Y_1$ is set to $u_1$. Herein, the centering represents an operation of subtracting a mean value of each row from individual element values of the row, and the scaling represents an operation (process) of dividing the individual element values of the row by a standard deviation of the row.

In a second stage of the method, after $w_i = X_i^T u_i / (u_i^T u_i)$ is calculated, a determinant of $w_i$ is normalized and then $t_i = X_i w_i$ is obtained. Further, the same process is executed for the matrix Y, i.e., after $c_i = Y_i^T t_i / (t_i^T t_i)$ is calculated, a determinant of $c_i$ is normalized and then $u_i = Y_i c_i / (c_i^T c_i)$ is obtained.

In a third stage of the method, an X loading $p_i = X_i^T t_i / (t_i^T t_i)$ and a Y loading $q_i = X_i^T u_i / (u_i^T u_i)$ are obtained. Next, $b_i = u_i^T t_i / (t_i^T t_i)$ is obtained by allowing u to regress to t. Subsequently, residual matrices $X_i = X_i - t_i p_i^T$ and $Y_i = Y_i - b_i t_i c_i$ are obtained. Further after i is increased to be i+1, the processes of the second and third stages are repeated. A series of these processes are repeatedly executed by the program of the PLS method until a predetermined stop condition is satisfied or the residual matrix $X_{i+1}$ converges to "0", thus obtaining a maximum eigenvalue of the residual matrix and an eigenvector thereof.

The PLS method is characterized in that the residual matrix $X_{i+1}$ rapidly converges to the stop condition or "0" by only repeating the above stages approximately ten times. Generally, the residual matrix converges to the stop condition or "0" by iterating the stages four or five times. Through the use of the maximum eigenvalue and the eigenvector thereof obtained by the above calculating process, a first principal component of the matrix $X^T Y$ can be obtained and a maximum correlation between the X and Y matrices can be detected.

(Operation of Processing Apparatus)

In the ensuing discussion, the operation of the processing apparatus 100 will be described in detail. In this embodiment, after the above equation Eq. (1) is obtained to predict process characteristics using a multivariate analysis, a predetermined number of wafers W are processed. In a processing stage for a wafer W, the process characteristics at an arbitrary time can be predicted by applying operation data obtained at the arbitrary time to equation Eq. (1).

If the operation of the processing apparatus 100 begins, the wafer W is carried into the processing chamber 101 through the gate with the gate valve 106 opened, and placed on the lower electrode 102 after the support 103 descends up to the lower chamber 101B of the processing chamber 101 through the ball screw mechanism 112. After the wafer W is carried into the processing chamber 101, the exhaust system 119 is operated to maintain a predetermined vacuum level in the processing chamber 101 after the gate valve 106 is closed. At this time, He gas is supplied into the processing chamber 101 as backside gas from the gas introduction mechanism 115 at a center pressure of 13.3 hPa and an edge pressure of 59.9 hPa. Therefore, heat conductivity between the wafer W and the lower electrode 102, particularly, between the wafer W and the electrostatic chuck 108, is increased, thus increasing the cooling efficiency of the wafer W. Further, the temperatures of the upper electrode 104, the lower electrode 102 and a sidewall of the processing chamber 101 are set to 60° C., 40° C. and 60° C., respectively.

In the meantime, process gas is supplied into the processing chamber 101 from the process gas supply system 118. In particular, $C_5F_8$ gas, $O_2$ gas, and Ar gas are supplied thereto at gas flow rates of 12 sccm, 20 sccm and 1300 sccm, respectively. At this time, the pressure of the processing chamber 101 is, for example, 4.7 Pa. In this state, for example, RF power of 60 MHz at 2800 W is applied from the RF power source 104E to the upper electrode 104, while, for example, RF power of 13.56 MHz at 3660 W is applied from the RF power source 107 to the lower electrode 102. Accordingly, a magnetron discharge occurs together with the operation of the dipole ring magnet 105, so that the plasma of the process gas is generated and then the oxide film of the wafer W is etched. After the termination of the etching, the processed wafer W is carried out of the processing chamber 101 through operations reverse to the operations of carrying the wafer W into the processing chamber 101, and then the same process is repeatedly executed with respect to a subsequent wafer W. In this way, a predetermined number of wafers are processed, so that a series of processes are terminated. Further, with respect to a test wafer to be used when a model is obtained using a multivariate analysis, the amount of CD shift of each of the wafers W is obtained and then used as the process result data.

(Method for Predicting Process Results)

Hereinafter, a method for predicting actual process results using the operation data and the process result data obtained through the above process will be described in detail.

First Prediction: Preliminary Prediction

First, a prediction is performed using the above operation data and process result data. That is, a multivariate analysis is performed on the basis of the operation data and the process result data, so that a correlation (regression equation Eq. (1) using the PLS method) between the operation data and the process result data is obtained (a first analysis step and a first analysis unit). In this embodiment, the emission spectrum intensity for each of the wafers when the wafer is etching processed is used as the explanatory variable X of the regression equation Eq. (1) of the PLS method, and the amount of CD shift of a hole formed on the wafer by the etching process is used as the process result data, thus obtaining equation Eq. (1) of the PLS method.

Next, on the basis of the obtained correlation, process results are predicted using operation data obtained when wafers other than the wafers used to obtain the correlation are processed (a first prediction step and a first prediction unit).

Specifically, the regression equation Eq. (1) is obtained using the PLS method by utilizing optical data and the amount of CD shift, obtained when first to fifteenth wafers are etching processed, as training data.

Figure 4:
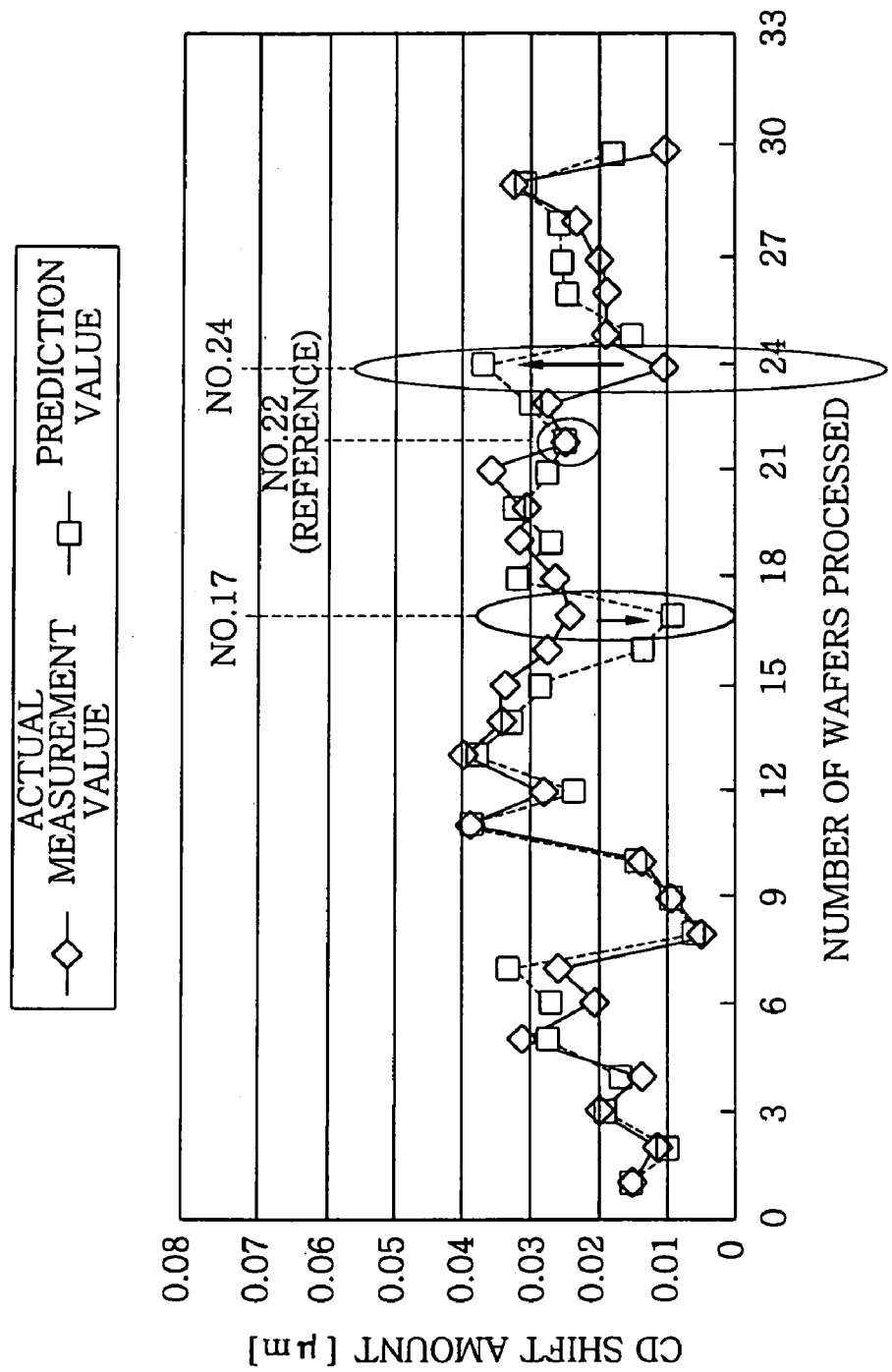
FIG. 4 charts a graph showing actual measurement values and prediction values obtained by performing a first prediction based on optical data by employing a multivariate analysis device in accordance with the preferred embodiment of the present invention.

Thereafter, optical data, collected when sixteenth to thirtieth wafers are etching processed, are applied to the regression equation Eq. (1) to obtain the prediction values for the amount of CD shift. The results of the comparison of the prediction values for the amount of CD shift obtained in this way with actual measurement values for the amount of CD shift are shown in FIG. 4. In FIG. 4, the amount of CD shift is indicated on a vertical axis, while the number of wafers processed is indicated on a horizontal axis. Referring to FIG. 4, prediction values are almost equal to actual measurement values with respect to the first to fifteenth wafers, because the regression equation Eq. (1) is obtained using data on the first to fifteenth wafers. It can be seen in FIG. 4 that prediction values greatly deviate or shift from actual measurement values with respect to seventeenth and twenty-fourth wafers NO. 17 and NO. 24, so that prediction accuracy is deteriorated.

Selection of Operation Data

Next, on the basis of the prediction results (for example, the prediction results of FIG. 4) obtained at the first analysis step, a multivariate analysis is performed with respect to remaining operation data except for operation data adversely influencing prediction accuracy among the operation data obtained at locations where prediction accuracy is deteriorated as in the case of the seventeenth and twenty-fourth wafers in FIG. 4. At this time, each of wavelength data of the operation data may be preferably weighted and a weighting value for wavelength data adversely influencing the prediction accuracy may be decreased, so that its influence on the prediction accuracy can be suppressed.

Hereinafter, a detailed example of the weighted operation data will be described. When the operation data is used as the explanatory variable X in the regression equation (relational expression) Eq. (1) in accordance with the PLS method, the weighted operation data is obtained by multiplying weighting coefficients by respective operation data and then set to the explanatory variable X. For example, in the case where optical data of wavelengths $\lambda \cdot 1$ to $\lambda \cdot m$ are used for the explanatory variable X, X can be expressed by the following equation Eq. (4) using optical data x(t) and weighting vector F(t) if optical data obtained at the time of processing a t-th wafer is data t(t=1 to i), $$X = F(t) \cdot x(t) \quad \text{Eq. (4)}$$

In Eq. (4), x(t) and F(t) can be expressed by the following Eqs. (5) and (6), respectively. In this embodiment, since the emission spectrum intensities of 153 wavelengths arranged at intervals of 5 nm within a range of 195 to 955 nm are used as the optical data, the emission spectrum intensities of the wavelengths are applied to $x_{\lambda 1}$ to $x_{\lambda m}$, respectively.

$$x(t) = (x_{\lambda 1}(t), x_{\lambda 2}(t), \ldots, x_{\lambda m}(t))^T \quad \text{Eq. (5)}$$

$$= \begin{bmatrix} x_{\lambda 1}(1) & x_{\lambda 2}(1) & \cdots & x_{\lambda m}(1) \\ x_{\lambda 1}(2) & x_{\lambda 2}(2) & \cdots & x_{\lambda m}(2) \\ \vdots & \vdots & \vdots & \vdots \\ x_{\lambda 1}(i) & x_{\lambda 2}(i) & \cdots & x_{\lambda m}(i) \end{bmatrix}^T$$

$$= \begin{bmatrix} \text{spectrum of data 1} \\ \text{spectrum of data 2} \\ \vdots \\ \text{spectrum of data } i \end{bmatrix}^T$$

$$F(t) = \{f_{\lambda 1}(1), f_{\lambda 2}(2), \ldots, f_{\lambda m}(t)\} \quad \text{Eq. (6)}$$

Among the weighted operation data, if a weighting coefficient is set to "0", operation data corresponding to the weighting can be eliminated, while if a weighting coefficient is set to "1", operation data corresponding to the weighting coefficient can remain. Further, as the weighting coefficient is increased or decreased within a range of 0 to 1, the influence of the operation data corresponding to the weighting coefficient on the regression equation Eq. (1) can be controlled. For example, the influence of wavelength data adversely influencing prediction accuracy on the regression equation Eq. (1) can be suppressed by decreasing the weighting coefficient thereof.

In the following, a method for setting the weighting coefficients of the weighted operation data will be described. Herein, the weighting coefficients of the respective operation data used for the first analysis are determined on the basis of the results of the first prediction (a weighting coefficient setting step and a weighting coefficient setting unit). In particular, in the results of the first prediction, a first contribution (or contribution ratio) of operation data, obtained when a prediction value deviates or shifts above an actual measurement value, and a second contribution (or contribution ratio) of operation data, obtained when a prediction value deviates or shifts below an actual measurement value, are calculated to determine each of the weighting coefficients based on a difference between the first and second contributions.

In general, the contribution (occasionally, referred to as a "contribution ratio") means a ratio indicating the extent to which a variation of a specific item are contributed to all variations in a time series of statistical numeric values for a group of complex statistical events. In this embodiment, the contribution is obtained by calculating a difference between reference operation data (emission data) and certain operation data with respect to each variable (for example, each wavelength component), in which standardized regression coefficients are accumulated.

A method for setting weighting coefficients when weighted optical data are used as the weighted operation data will now be described. For example, according to the prediction results obtained by the first prediction shown in FIG. 4, a prediction value for the seventeenth wafer NO. 17 most significantly deviates or shifts below an actual measurement value therefor. Further, a prediction value for the twenty-fourth wafer NO. 24 most significantly deviates or shifts above an actual measurement value therefor. In contrast, a prediction value for the twenty-second wafer NO. 22 is equal to an actual measurement value therefor. Therefore, optical data obtained when the twenty-second wafer NO. 22 is etching processed becomes reference data, so that respective contributions are obtained based thereon.

Figure 5:
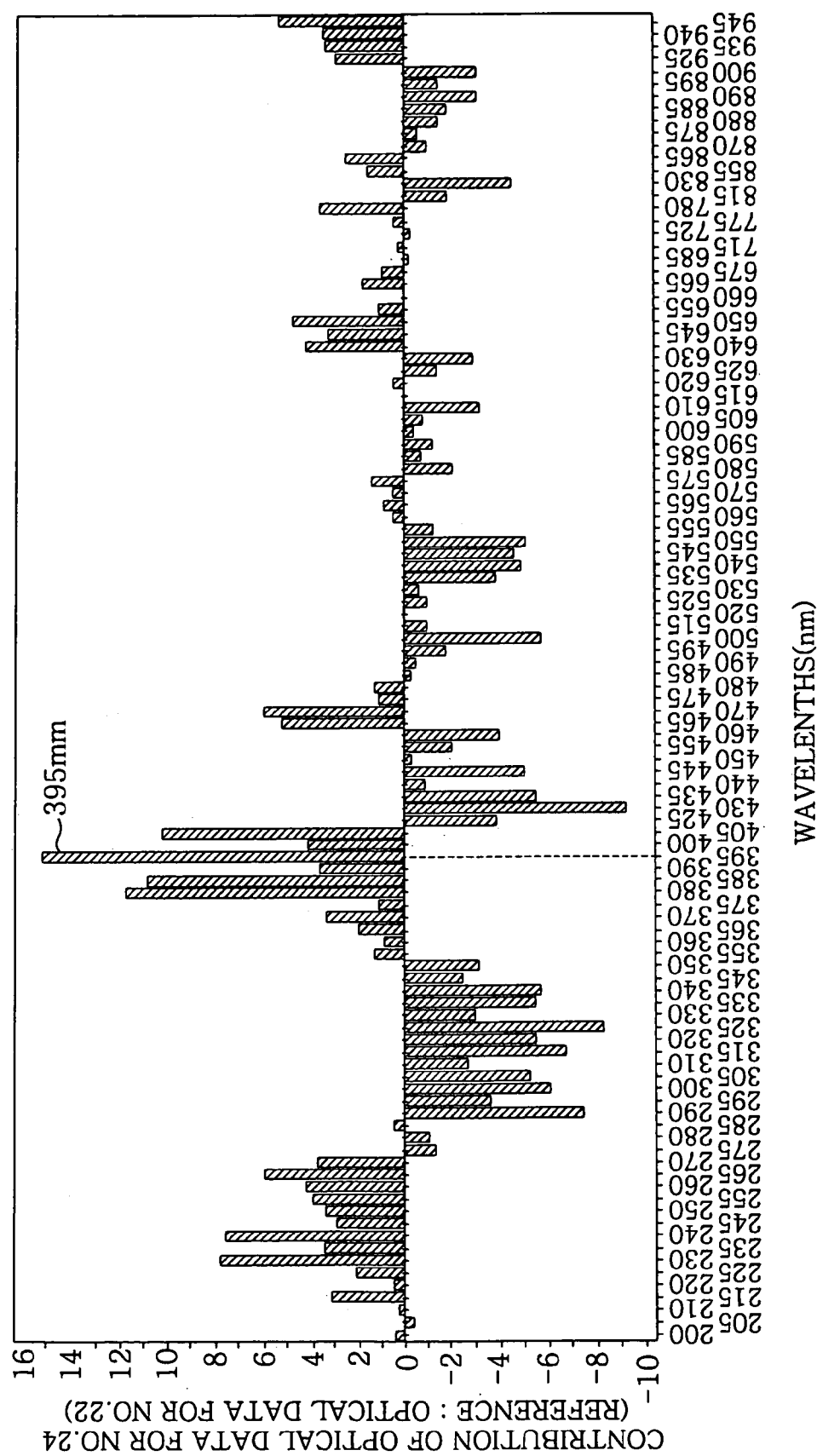
FIG. 5 describes a bar graph showing the contributions of the optical data for a wafer No. 24 shown in FIG. 4.
Figure 6:
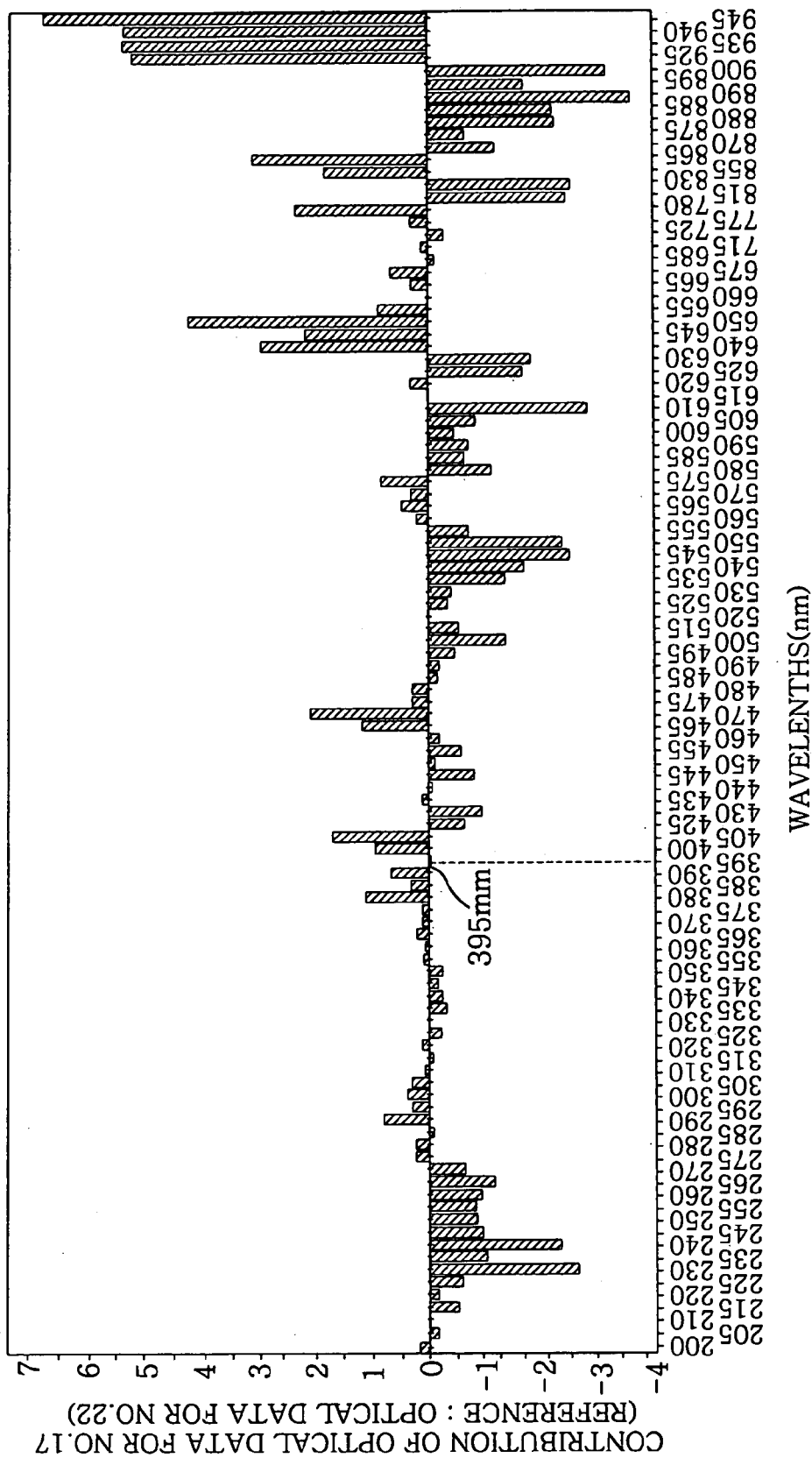
FIG. 6 depicts a bar graph showing the contributions of the optical data for a wafer No. 17 shown in FIG. 4.

The respective contributions are depicted in FIGS. 5 and 6 in the form of bar graphs. FIG. 5 shows contributions obtained by subtracting the optical data for the twenty-second wafer NO. 22 from that for the twenty-fourth wafer NO. 24. FIG. 6 shows contributions obtained by subtracting the optical data for the twenty-second wafer NO. 22 from that for the seventeenth wafer NO. 17.

In FIGS. 5 and 6, a contribution is indicated on a vertical axis and a wavelength is indicated on a horizontal axis. Further, in FIGS. 5 and 6, data of a saturated wavelength is excluded from the optical data in advance. The saturated wavelength represents a wavelength at which the optical measurement device 120 reaches measurement limitations, that is, the amount of emission is saturated and unable to be accurately measured. Since it is not preferable to use such data for prediction, the saturated wavelength data is excluded from the optical data. Determination on whether a corresponding wavelength is a saturated wavelength or not is performed in such a way that a wavelength at which the amount of emission represents a certain value for nine seconds or longer during the etching process is considered as a saturated wavelength.

In FIGS. 5 and 6, data of a wavelength with a higher contribution contributes much to prediction results. In FIG. 5, for example, the emission spectrum intensity data of a wavelength of 395 nm most significantly contributes to the prediction results. Therefore, since data adversely contributing to the prediction results can be identified, improved prediction results can be expected if prediction is performed again using the PLS method after eliminating such data.

However, the data of a wavelength of 395 nm has a highest contribution in FIG. 5, but a low contribution in FIG. 6. In this way, it is not necessary that data contributing toward causing a prediction value to deviate above an actual measurement value corresponds to data contributing toward causing the prediction value to deviate below the actual measurement value, and vice versa.

Based on the above fact, there is calculated a difference between a contribution of data (a first contribution) obtained when a prediction value deviates above an actual measurement value and a contribution of data (a second contribution) obtained when a prediction value deviates below an actual measurement value. Thereafter, in performing a prediction using the PLS method, data are sequentially eliminated from optical data by setting corresponding weighting coefficients to "0" in the descending order of corresponding contribution differences, or the corresponding weighting coefficients are decreased, thus reducing its influence on the prediction results.

As described above, the weighting coefficients are set so that prediction results can be corrected even in a case where a prediction value deviates below an actual measurement value, as well as a case where a prediction value deviates above an actual measurement value, thus setting the weighting coefficients to be reasonable as a whole. Further, with respect to operation data having a more adverse influence on prediction accuracy in the first prediction (preliminary prediction), the influence thereof can be reduced in a second prediction (main prediction).

Figure 7:
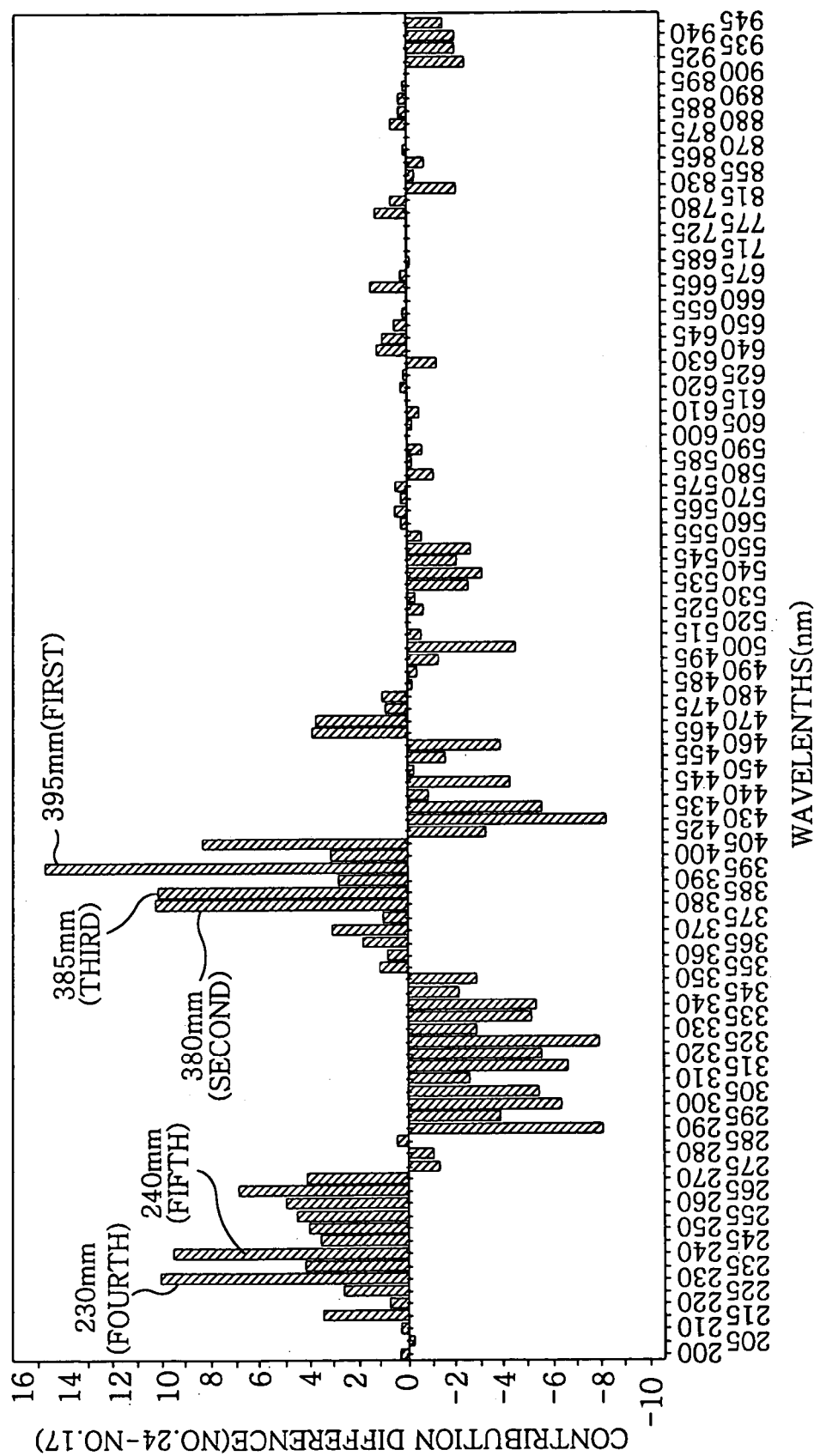
FIG. 7 exhibits a bar graph showing differences obtained by subtracting the contributions of the optical data for the wafer No. 17 from those of the optical data for the wafer No. 24.

As a detailed example, FIG. 7 shows differences between contributions of FIGS. 5 and 6 (contributions of wafer NO. 24–contributions of wafer NO. 17) in the form of a bar graph. FIG. 8 shows a table in which the differences between contributions in FIG. 7 are arranged in a descending order. Referring to FIGS. 7 and 8, a contribution at a wavelength of 395 nm represents a most adverse influence on the prediction results. Further, a contribution at wavelengths of 380 nm and 385 nm second and third adverse influence on the prediction results, respectively. For example, in order to eliminate data of wavelengths in the first to fifth orders of FIG. 8, weighting coefficients, which are components of a weighting vector F corresponding to the wavelengths may be set to "0". A method for obtaining an optimum number of pieces of wavelength data to be eliminated from optical data will be described later.

Second Prediction: Main Prediction

Next, a multivariate analysis is performed on the basis of the weighted operation data and the process result data to obtain a correlation between the weighted operation data and the process result data (a second analysis step and a second analysis unit). Thereafter, on the basis of the obtained correlation, process results are predicted using operation data obtained when wafers other than the wafers used to obtain the correlation are processed (a second prediction step and a second prediction unit).

Hereinafter, as a detailed example, results of the second prediction using the above-described weighted optical data and CD shift amount data will be described with reference to FIGS. 9 to 14. That is, the regression equation Eq. (1) is obtained in accordance with the PLS method using the weighted optical data and the CD shift amount data obtained with respect to the first to fifteen wafers NO. 1 to NO. 15. Optical data, collected when sixteenth to thirtieth wafers NO. 16 to NO. 30 are etching processed, are then applied to the regression equation Eq. (1) to obtain the prediction values for the CD shift amount.

Figure 9:
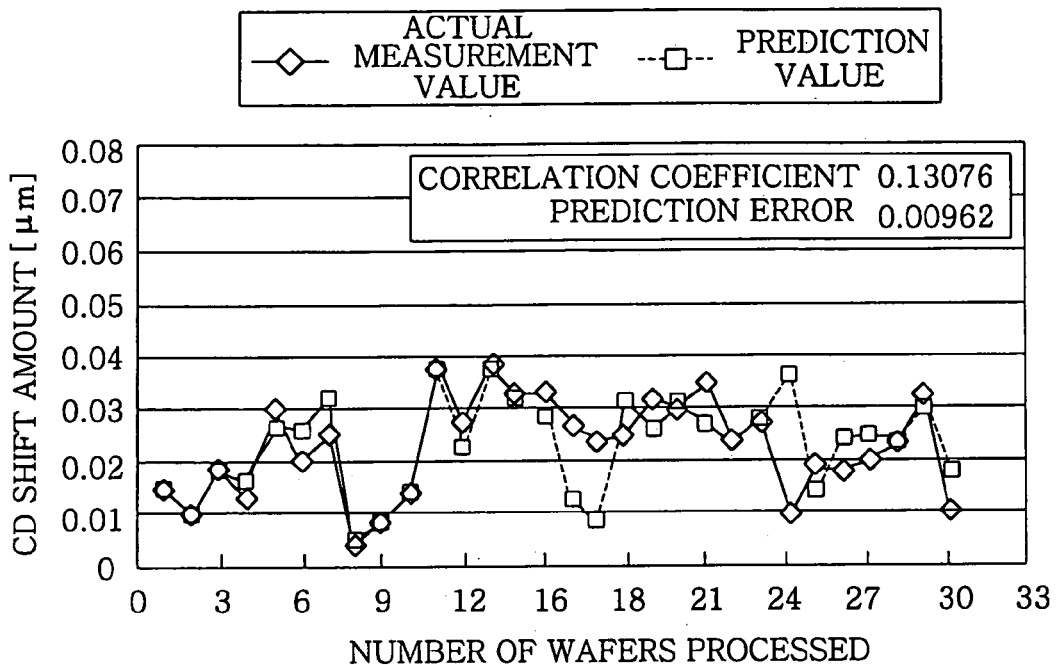
FIGS. 9 to 12 illustrate graphs showing actual measurement values and prediction values obtained by performing a second prediction based on weighted optical data by employing the multivariate analysis in accordance with the preferred embodiment of the present invention.
Figure 10:
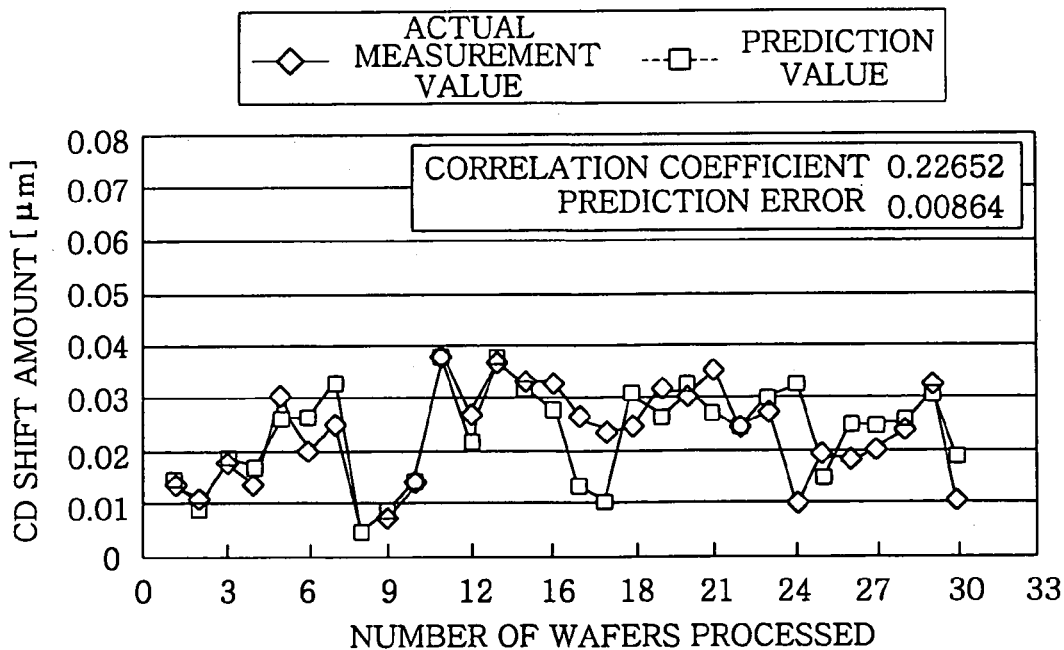
Figure 11:
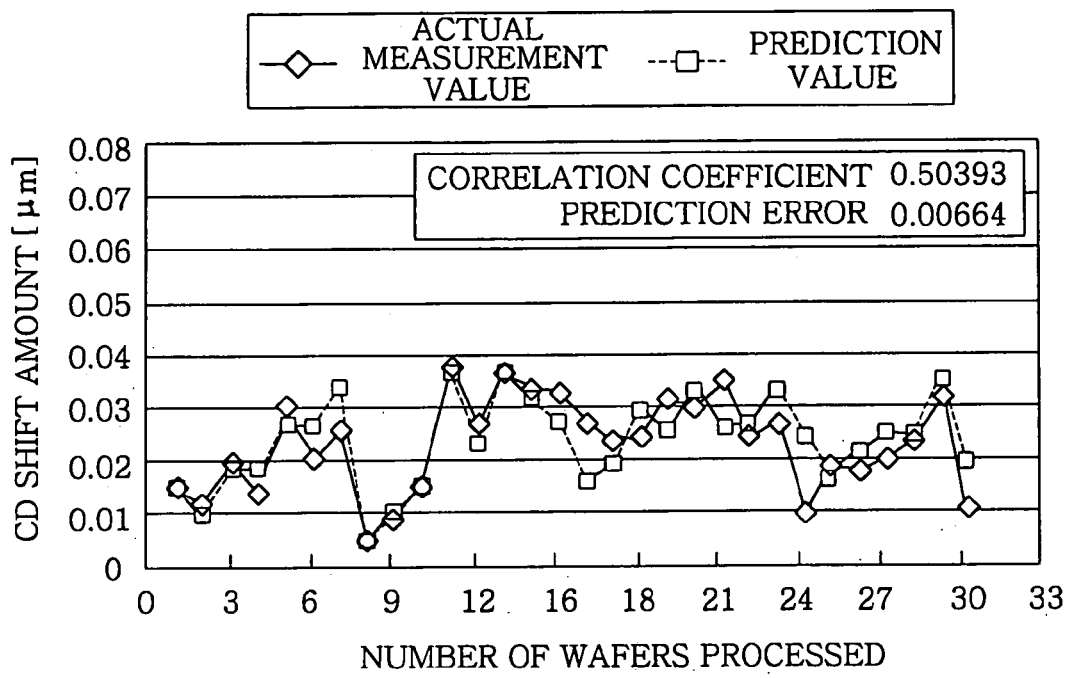
Figure 12:
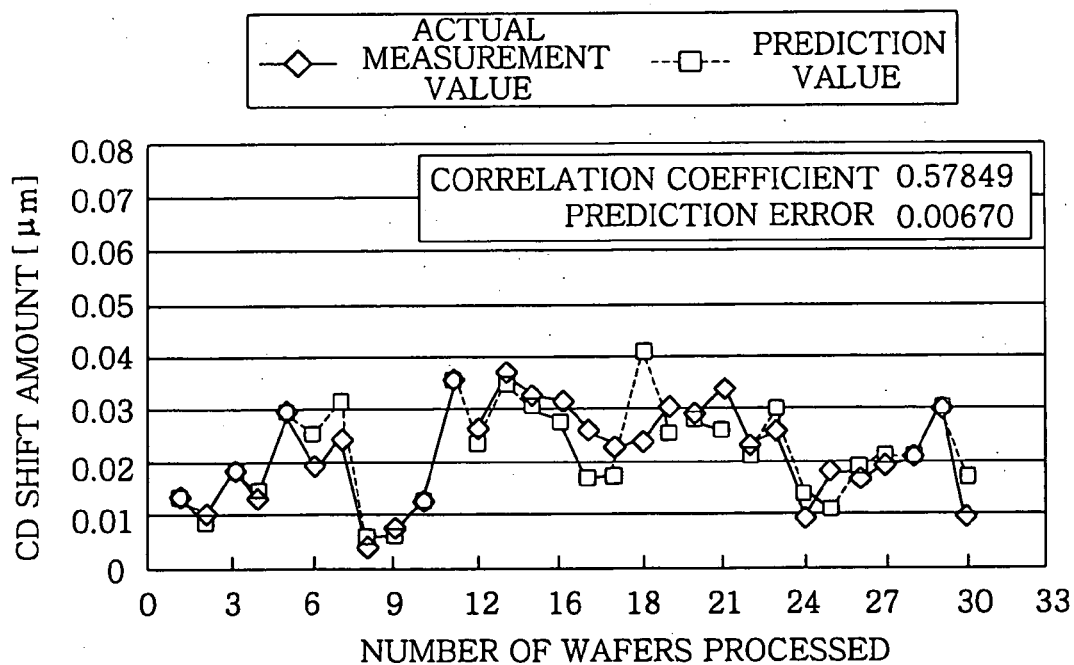

FIG. 9 shows a relationship between prediction values and actual measurement values when only the data of the saturated wavelengths is eliminated by setting weighting coefficients corresponding thereto to "0". FIG. 10 shows a relationship between prediction values and actual measurement values when the data of the saturated wavelengths and the data of a wavelength of 395 nm, which has a highest value in FIG. 8, are eliminated by setting the weighting coefficients corresponding thereto to "0". FIG. 11 shows a relationship between prediction values and actual measurement values obtained when data of the saturated wavelengths and data of wavelengths, which have highest twenty values in FIG. 8, are eliminated by setting weighting coefficients corresponding thereto to "0". FIG. 12 illustrates a relationship between prediction values and actual measurement values obtained when data of the saturated wavelengths and data of wavelengths, which have highest forty values in FIG. 8, are eliminated by setting the weighting coefficients corresponding thereto to "0".

In FIGS. 9 to 12, prediction errors PE are shown in the graphs. These prediction errors PE are obtained by subtracting prediction values from the actual measurement values of process result data for respective wafers, squaring differences obtained from the subtraction, and summing up the squared results, dividing the summed result by the number of wafers processed, and then obtaining a square root of the divided result. The prediction error PE of "0" indicates best prediction accuracy. Further, as the PE becomes smaller, an error between actual measurement values and prediction values is considered to be smaller.

Further, correlation coefficients R are shown in the graphs of FIGS. 9 to 12. Generally, the correlation coefficient is one of indexes indicating, for example, a level of a relation between two variables x and y, and a correlation coefficient $R_{xy}$ can be expressed by the following Eq. (7), $$R_{xy} = \frac{S_{xy}}{\sqrt{S_x S_y}} = \frac{\sum (X_i - x)(Y_i - y)}{\sqrt{\sum (X_i - x)^2 (Y_i - y)^2}} \quad \text{Eq. (7)}$$

where $S_{xy}$ is covariance, and $S_x$ and $S_y$ are standard deviations. A correlation coefficient R of "1" means that the level of the relation is highest. Further, as a value of the correlation coefficient R becomes larger, it is considered that there is a higher correlation. Consequently, as the prediction error PE approaches "0" and the correlation coefficient R approaches "1", prediction accuracy is improved. From this viewpoint, referring to FIGS. 9 to 12, the PE values are decreased in the order of FIGS. 9 to 12, and the correlation coefficient R values approach "1" in the order of FIGS. 9 to 12. Therefore, it can be seen that the prediction results are improved in the order of FIGS. 9 to 12.

Figure 13:
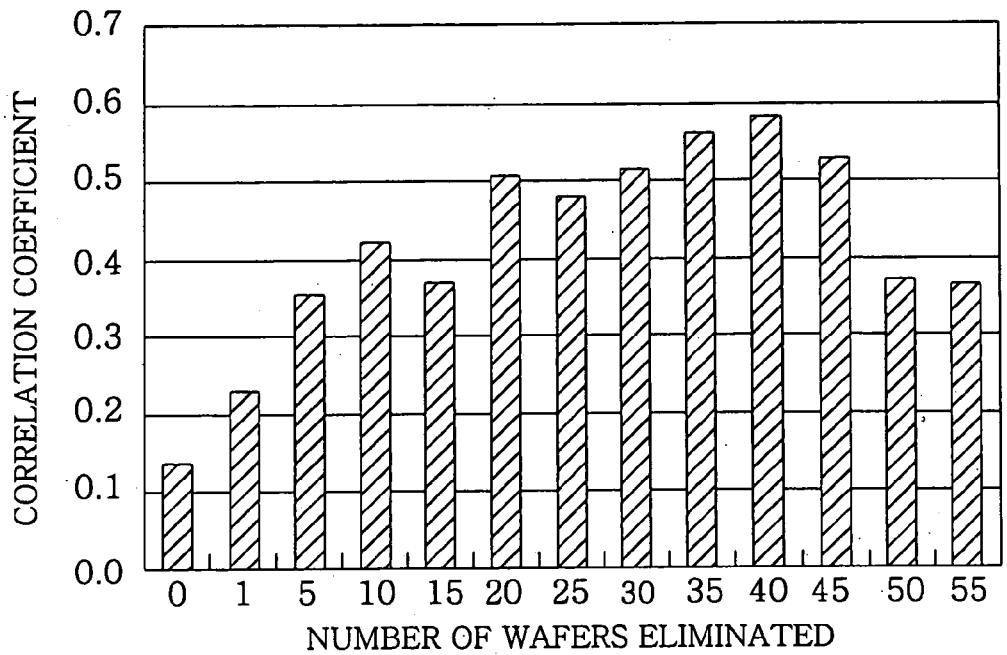
FIG. 13 charts a graph showing a relationship between the number of wavelengths eliminated from the optical data and a correlation coefficient in accordance with the preferred embodiment of the present invention.
Figure 14:
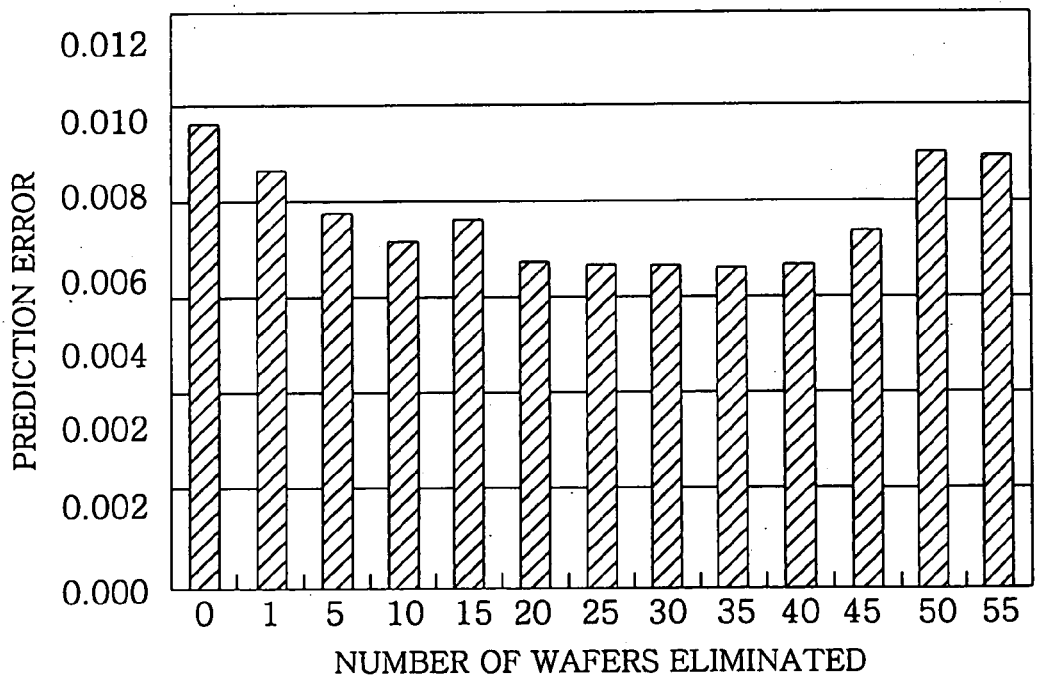
FIG. 14 depicts a graph showing a relationship between the number of wavelengths eliminated from the optical data and a prediction error in accordance with the preferred embodiment of the present invention.

Meanwhile, FIG. 13 depicts a relationship between the number of wavelengths eliminated from optical data and the correlation coefficient R, and FIG. 14 shows a relationship between the number of wavelengths eliminated from the optical data and the prediction error PE. The number of wavelengths eliminated in the descending order shown in FIG. 8 is indicated on horizontal axes of FIGS. 13 and 14. Referring to FIGS. 13 and 14, as the number of wavelengths eliminated is increased up to about 40 wavelengths, the correlation coefficient R approaches "1" and the prediction error PE is decreased, which means that prediction results are gradually improved. On the other hand, if the number of wavelengths eliminated exceeds 40, the correlation coefficient R is decreased and the prediction error PE is increased, which means that prediction results are gradually deteriorated.

As described above, it is considered that, as the correlation coefficient R approaches "1", a correlation is strengthened and prediction accuracy is improved. However, as the number of pieces of data used in prediction becomes larger and smaller, the reliability of the correlation coefficient R differs even though the values thereof are the same.

Therefore, there is a need for determining what number of wavelengths, eliminated from the optical data, allows the reliability of the correlation coefficient R to be high and optimum prediction results to be obtained. In this case, the correlation coefficient R may be approved through a statistical method.

For example, the approval of the correlation coefficient R may be performed through a statistical hypothesis testing. Generally, the statistical hypothesis testing is a method for formulating a hypothesis for an event to be approved and obtaining an occurrence probability of the event when it is determined that the hypothesis is correct, using a statistic based on a statistical distribution obtained from test data. Whether the occurrence probability is a scarcely occurring probability is determined by comparing the occurrence probability with a preset very low probability (significance level or hazard rate). If the occurrence probability obtained from the test data is less than the significance level, it is determined that corresponding test results, which scarcely occurs, are generated, and then the hypothesis is rejected. Further, because the hypothesis, formulated before the statistical hypothesis testing, is premised to be rejected, the hypothesis is referred to as a "null hypothesis". Further, a hypothesis adopted when the null hypothesis is rejected is referred to as an "alternative hypothesis". Typically, the object of the approval is to prove the alternative hypothesis.

The approval of the correlation coefficient R is executed using the fact that a statistic t follows t distribution with a degree of freedom of 2. A null hypothesis of the approval is formulated as "the correlation of population $\rho_{xy}=0$ (no correlation). The statistic t is obtained by the following equation Eq. (8) if n is the number of pieces of data.

$$t = \frac{\sqrt{n - 2} R_{xy}}{\sqrt{1 - R_{xy}^2}} \quad \text{Eq. (8)}$$

A rejection limit is obtained on the basis of a t distribution table using a preset significance level (hazard rate) $\alpha$ and the degree of freedom $\phi=n-2$. If the statistic t is greater than the rejection limit, it can be determined that the correlation coefficient R is significant and its reliability is high. Further, the significance level $\alpha$ between 1% and 10%, typically, 5% is employed. The significance level $\alpha$ needs to be determined within a most practical range depending on, for example, the types of operation data or process results data.

For example, in this embodiment, since the number of pieces of data n is 15 for the wafers NO. 1 to NO. 15, the degree of freedom $\phi$ is 15−2=13. A rejection limit at a significance level (hazard rate) $\alpha=5\%$ for the correlation coefficient R was 0.497. Therefore, referring to the bar graph of the correlation coefficient with a statistic of t, it can be seen that a case where the correlation coefficient R is equal to or greater than 0.514, that is, a case where the number of wavelengths eliminated from the optical data is approximately 30 to 45, is statistically significant, thus obtaining high reliability to such an extent that the significance level (hazard rate) $\alpha=5\%$.

As described above, the present invention performs a first prediction (preliminary prediction) using collected operation data, for example, optical data, sets a weighting coefficient F(t) on the basis of results of the first prediction to obtain weighted optical data, and then performs a second prediction (main prediction) to calculate prediction values. Therefore, after the influence of data (for example, wavelength data) having adversely influenced prediction results through the first prediction (preliminary prediction) is eliminated or decreased, the second prediction (main prediction) can be performed. Accordingly, prediction accuracy can be improved.

Although, in this embodiment of the present invention, optical data, such as the emission spectrum intensities of wavelengths, are used as the operation data, trace data or VI probe data may be used as the operation data. That is, with respect to the trace data or the VI probe data, weighting coefficients may be set on the basis of a first prediction (preliminary prediction), and a second prediction (main prediction) may be performed with respect to weighted operation data.

As the trace data, there can be used, for example, gas flow rates measured by the mass flow controllers 118C, 118F and 118I, the APC opening ratio of the APC valve 101D, data on current and power applied to the electrostatic chuck 108 and detected by the power meter 109A, the gas pressure of backside gas detected by the pressure gauge 115B, a value measured by the matching circuit 107A (for example, the positions of the variable condensers C1 and C2 in a matching state, and a voltage Vdc between the RF power supply line (feeder line) and the ground), and values measured by the electrical measurement device (VI probe) 107C (for example, progressive wave and reflection wave of RF power).

As the VI probe data, there can be used, for example, RF voltage V, RF current I, RF phase P and impedance Z of harmonic waves, which are measured by the electrical measurement device (VI probe) 107C.

Further, in this embodiment of the present invention, for example, the process dimensions of an object to be processed, such as the dimensions of a shape formed by an etching process, are used as the process result data. Accordingly, process dimensions, a measurement of which requires a lot of time and manual operations, are predicted with high accuracy, thus simplifying the monitoring of the process dimensions. Further, with respect to the total number of objects to be processed, process dimensions can be predicted with high accuracy, thus performing suitable monitoring.

As the process result data, etching rates according to the etching process may be used. Further, data related to apparatus status, including a film thickness of a by-product generated in the processing chamber and an attrition rate of a part such as the focus ring 110A may be used as the process result data. The cleaning time of the processing apparatus 100 or the replacement time of the part such as the focus ring 110A may be predicted by utilizing the film thickness of the by-product and the attrition rate of the part such as the focus ring 110A as the apparatus status data.

Further, although the present invention has been described with respect to only a case where the wafer W is etching processed, it can also be applied to a processing apparatus for a film forming process as well as the etching process. Further, the object to be processed in the present invention is not limited to a wafer.

While the invention has been shown and described with respect to the preferred embodiments, it will be understood by those skilled in the art that various changes and modifications may be made without departing from the spirit and scope of the invention as defined in the following claims.

For example, when the weighting coefficients of the operation data are set before the second prediction is performed, plural sets of weighting coefficients may be obtained on the basis of different references with respect to the operation data of the same object to be processed, and a multivariate analysis is performed for weighted operation data obtained by the respective set of weighting coefficients to predict process results. Then, a set of weighting coefficients, obtained when the predicted process results are closest to actual process results, may be used to generate the weighted operation data. For example, in the embodiment of the present invention, the contributions have been obtained on the basis of the data on the wafer NO. 22 as shown in FIG. 4 and the weighting coefficients have been determined on the basis of the contributions. However, the contributions may be obtained on the basis of the data on a plurality of wafers, including the wafers NO. 20 and NO. 28 shown in FIG. 4, and plural sets of weighting coefficients may be determined on the basis of the contributions. Therefore, the weighting coefficients can be adjusted to more suitable values, thus further improving prediction accuracy.

Further, the etching plasma apparatus of the present invention is not limited to a parallel plate-type plasma etching apparatus, but a helicon wave plasma etching apparatus or an inductive coupling-type plasma etching apparatus can be used as the etching plasma apparatus.

As described above, the present invention provides a method and an apparatus for predicting process results, which performs a first prediction (preliminary prediction) using collected operation data, sets weighting coefficients on the basis of results of the first prediction to obtain weighted optical data, and then performs a second prediction (main prediction) to calculate prediction values. Therefore, the influence of operation data having adversely influenced prediction results through the first prediction (preliminary prediction) can be eliminated or decreased to perform the second prediction (main prediction), thus improving prediction accuracy.

What is claimed is:

1. A method for predicting process results on the basis of operation data and process result data of a processing apparatus while a plurality of objects are processed in a processing chamber of the processing apparatus, comprising the steps of:
   (a) collecting operation data and process result data obtained at the time of processing each of the objects;
   (b) performing a multivariate analysis on the basis of the collected operation data and process result data to obtain a first correlation between the operation data and the process result data;
   (c) predicting process results using operation data, obtained when objects other than the objects used to obtain the first correlation are processed, on the basis of the first correlation;
   (d) setting weighting coefficients for the respective operation data used at the step (b) on the basis of the predicted process results at the step (c);
   (e) obtaining weighted operation data by multiplying the operation data by the respective weighting coefficients corresponding thereto, and performing a multivariate analysis on the basis of the weighted operation data and the process result data to obtain a second correlation between the weighted operation data and the process result data; and
   (f) predicting process results using operation data, obtained when objects other than the objects used to obtain the second correlation are processed, on the basis of the second correlation.

2. The method of claim 1, wherein the weighting coefficient setting step (d) comprises:
   comparing actual process results with the predicted process results in the first prediction step (c), which are obtained at the time of processing each of the objects;
   obtaining a first contribution of the operation data, which indicates that the predicted process results of the first prediction deviate above the actual process results, and a second contribution of the operation data, which indicates that the predicted process results of the first prediction deviate below the actual process results; and
   setting the weighting coefficients on the basis of a difference between the first and the second contributions.

3. The method of claim 2, wherein the first contribution is a contribution of operation data, obtained when the predicted process results of the first prediction deviates above the actual process results, with respect to reference operation data; and the second contribution is a contribution of operation data, obtained when the predicted process results of the first prediction deviate below the actual process results, with respect to the reference operation data.

4. The method of claim 2, wherein, as the difference between the first and second contributions is larger, a lower weighting coefficient is set, while as the difference is smaller, a higher weighting coefficient is set.

5. The method of claim 1, wherein the weighting coefficient setting step (d) comprises:
  obtaining plural sets of weighting coefficients, each of the sets being based on different references with respect to operation data of the same object;
  performing a multivariate analysis with respect to weighted operation data obtained for each set of weighting coefficients to predict process results; and
  setting a set of weighting coefficient obtained when the predicted process results are closest to actual process results.

6. The method of claim 1, wherein in the weighting coefficient setting step (d), each of the weighting coefficients is set to "0" or "1".

7. The method of claim 1, wherein the operation data are optical data.

8. The method of claim 1, wherein the process result data are process dimensions of an object to be processed.

9. The method of claim 1, wherein the multivariate analysis is performed by employing a Partial Least Squares (PLS) method.

10. An apparatus for predicting process results on the basis of operation data and process result data of a processing apparatus while a plurality of objects are processed in a processing chamber of the processing apparatus, comprising:
  a data collection unit for collecting operation data and process result data obtained at the time of processing each of the objects;
  a first analysis unit for performing a multivariate analysis on the basis of the collected operation data and process result data and obtaining a first correlation between the operation data and the process result data;
  a first prediction unit for predicting process results using operation data, obtained when objects other than the objects used to obtain the first correlation are processed, on the basis of the first correlation;
  a weighting coefficient setting unit for setting weighting coefficients for the respective operation data used by the first analysis unit on the basis of the predicted process results;
  a second analysis unit for obtaining weighted operation data by multiplying the operation data by the respective weighting coefficients corresponding thereto, and performing a multivariate analysis on the basis of the weighted operation data and the process result data to obtain a second correlation between the weighted operation data and the process result data; and
  a second prediction unit for predicting process results using operation data, obtained when objects other than the objects used to obtain the second correlation are processed, on the basis of the second correlation.

11. The apparatus of claim 10, wherein the weighting coefficient setting unit compares actual process results with the predicted process results by the first prediction unit, which are obtained at the time of processing each of the objects; obtains a first contribution of the operation data, which indicates that the predicted process results of the first prediction deviate above the actual process results, and a second contribution of the operation data, which indicates that the predicted process results of the first prediction deviate below the actual process results; and sets the weighting coefficients on the basis of a difference between the first and the second contributions.

12. The apparatus of claim 11, wherein the first contribution is a contribution of operation data, obtained when the predicted process results of the first prediction deviates above the actual process results, with respect to reference operation data; and the second contribution is a contribution of operation data, obtained when the predicted process results of the first prediction deviate below the actual process results, with respect to the reference operation data.

13. The apparatus of claim 11, wherein, as the difference between the first and second contributions is larger, a lower weighting coefficient is set, while as the difference is smaller, a higher weighting coefficient is set.

14. The apparatus of claim 10, wherein the weighting coefficient setting unit obtains plural sets of weighting coefficients, each of the sets being based on different references with respect to operation data of the same object; performs a multivariate analysis with respect to weighted operation data obtained for each set of weighting coefficients to predict process results; and sets a set of weighting coefficient obtained when the predicted process results are closest to actual process results.

15. The apparatus of claim 10, wherein the weighting coefficient setting unit sets each of the weighting coefficients as "0" or "1".

16. The apparatus of claim 10, wherein the operation data are optical data.

17. The apparatus of claim 10, wherein the process result data are process dimensions of an object to be processed.

18. The apparatus of claim 10, wherein the multivariate analysis is performed by employing a Partial Least Squares (PLS) method.

* * * * *